US009143276B2

(12) United States Patent
Zhou et al.

(10) Patent No.: US 9,143,276 B2
(45) Date of Patent: Sep. 22, 2015

(54) NESTED CRC (CYCLIC REDUNDANCY CHECK) CODE GENERATION METHOD AND DEVICE FOR DATA TRANSMISSION ERROR CONTROL

(71) Applicant: HUA ZHONG UNIVERSITY OF SCIENCE AND TECHNOLOGY, Wuhan, Hubei (CN)

(72) Inventors: Wenli Zhou, Hubei (CN); Binbin Duan, Hubei (CN)

(73) Assignee: Hua Zhong University of Science and Technology, Wuhan, Hubei (CN)

( * ) Notice: Subject to any disclaimer, the term of this patent is extended or adjusted under 35 U.S.C. 154(b) by 44 days.

(21) Appl. No.: 14/117,680

(22) PCT Filed: Nov. 23, 2012

(86) PCT No.: PCT/CN2012/085163
§ 371 (c)(1),
(2) Date: Nov. 14, 2013

(87) PCT Pub. No.: WO2014/071658
PCT Pub. Date: May 15, 2014

(65) Prior Publication Data
US 2014/0149821 A1 May 29, 2014

(30) Foreign Application Priority Data

Nov. 10, 2012 (CN) .......................... 2012 1 04466054

(51) Int. Cl.
*H03M 13/00* (2006.01)
*H04L 1/00* (2006.01)
*H03M 13/09* (2006.01)

(52) U.S. Cl.
CPC ............. *H04L 1/0061* (2013.01); *H03M 13/09* (2013.01); *H03M 13/616* (2013.01)

(58) Field of Classification Search
None
See application file for complete search history.

(56) References Cited

U.S. PATENT DOCUMENTS 6,101,624 A * 8/2000 Cheng et al. .................. 714/736
8,572,289 B1 * 10/2013 Johnson ....................... 709/250
(Continued)

FOREIGN PATENT DOCUMENTS

CN 1324517 11/2001
CN 1431594 7/2003
(Continued)

OTHER PUBLICATIONS

International Search Report for international application No. PCT/CN2012/085163, dated Aug. 8, 2013 (4 pages).

*Primary Examiner* — Daniel McMahon
(74) *Attorney, Agent, or Firm* — Hamre, Schumann, Mueller & Larson, P.C.

(57) ABSTRACT

A nested CRC code generation method for data transmission error control, comprising: segmenting the data to be computed, allocating a CRC code computing channel to each of the data segments according to the data type, computing CRC sub-codes by the computing channels, sorting the CRC sub-codes, and generating a nested CRC code by sending the sorted CRC sub-codes to the final CRC code computing channel directly or by using the sorted CRC sub-codes as the new data to be computed, repeating the above CRC sub-code computing process and sending the final sorted CRC sub-codes to the final CRC code computing channel. A nested CRC code generation device for data transmission error control, comprising: a data segmenting module, a computing channel selecting module, a multi-channel CRC code computing module, a data sorting module, a set of registers, a data distributor, a counter and a single-channel CRC code computing module.

4 Claims, 5 Drawing Sheets

(56) References Cited

U.S. PATENT DOCUMENTS

| | | |
|---|---|---|
| 2004/0071091 A1 | 4/2004 | Blanc et al. |
| 2005/0201554 A1* | 9/2005 | Kramer et al. .................. 380/28 |
| 2011/0191660 A1 | 8/2011 | Hathorn et al. |
| 2012/0324319 A1* | 12/2012 | Grinchuk et al. ............. 714/807 |
| 2012/0324321 A1* | 12/2012 | Chowdhury et al. ......... 714/807 |

FOREIGN PATENT DOCUMENTS

| | | |
|---|---|---|
| CN | 1604515 | 4/2005 |
| CN | 102082577 | 6/2011 |

* cited by examiner

NESTED CRC (CYCLIC REDUNDANCY CHECK) CODE GENERATION METHOD AND DEVICE FOR DATA TRANSMISSION ERROR CONTROL

CROSS-REFERENCE TO RELATED APPLICATIONS

This application is a national stage of International Patent Application No. PCT/CN2012/085163 with an international filing date of Nov. 23, 2012, designating the United States, now pending, and further claims priority benefits to Chinese Patent Application No. 201210446605.4 filed Nov. 12, 2012. The contents of all of the aforementioned applications, including any intervening amendments thereto, are incorporated herein by reference.

FIELD

This disclosure relates to data transmission error control technology in communications and computers, and more particularly, to a nested CRC code generation method and device for data transmission error control.

BACKGROUND

Description of the Related Art

Data is grouped before transmission in various types of data communications normally. The Frame Check Sequence (FCS) is attached to the end of the grouped data to realize error control to ensure the accuracy of data transfer. The Cyclic Redundancy Code (CRC) is commonly used to improve the reliability of data communications in data transfer as a kind of FCS for its high efficiency and high performance.

A CRC code is computed for the data to be transmitted and is attached to the end of the data by the transmitter in transmission. Another CRC code is computed for the received data by the same computation method by the receiver. The received data is correct if the two CRC codes are the same, otherwise the received data is incorrect and the data should be re-transmitted by the transmitter by various Automatic Repeat-request (ARQ) technologies.

Conventionally, the computation of a CRC code can be realized by software or hardware both operating in serial and parallel modes. Parallel CRC code computation is commonly used to improve computing speed to meet the requirement of real time and high speed in real-time and high-speed data communications. There are mainly two kinds of universal parallel computation methods: one is realized by XOR logic, remainder buffers and certain control circuits which can be further realized by Programmable Logic Device (PLD), Field Programmable Gate Array (FPGA), etc.; and another is realized by looking up the remainder table which can be realized by preparing a remainder table in advance, storing the remainder table by software or hardware. For the first method, the required logic resources increase significantly with the increase of the number of bits processed in parallel and the total delay of the registers increases gradually with the increase of the cascaded logic gates, which becomes the bottleneck of improving computing speed. As for the second method, a remainder table with a storage capacity of $(2^R \cdot R)$ bits is required for computing a R-bit CRC code, therefore, the storage capacity of the remainder table increases exponentially with the increase of R, which becomes the bottleneck of improving computing speed.

In order to further improve the computing speed of a CRC code, a method of segmenting the data in advance and computing the data segments in parallel by multiple parallel CRC computation channels was introduced on the basis of parallel computation.

A Chinese patent application (Publication No. CN1431594A) discloses a method of computing a CRC code by multiple-channel and multiple-bit in parallel. The method includes: segmenting the data to be computed into multiple data segments with a data length of $L_s$, and the last data segment has a data length $L_f$, and each of the others has a data length $L_s$; filling the data segments into N computation channels sequentially and computing each of the data segments in the N computation channels simultaneously to generate N CRC sub-codes; building division remainder conversion tables and generating the converted CRC sub-codes by looking up the division remainder conversion tables for the CRC sub-codes in the first N−1 computation channels (remainder conversion is not required for the CRC sub-code in the last channel); and generating the final CRC code for the data to be computed by XOR computation of the converted CRC sub-codes one by one. However, remainder conversion is required for each of the CRC sub-codes in the first N−1 calculating channels sequentially to generate the converted CRC sub-codes qualified for computing the final CRC sub-code, which results in the following disadvantages.

Firstly, remainder conversion is required for each of the computed CRC sub-codes in the first N−1 computing channels to generate the qualified CRC sub-codes by building division remainder conversion tables and looking up the division remainder conversion tables, according to the descriptions of the application mentioned above. The item of the remainder conversion table corresponding to the ith (where i is a positive integer and is less than N) computing channel is derived by looking up each item of a typical remainder conversion table $[(N-i) \cdot Q+P]$ times successively, where $L_s$ is Q times of the number of bits R of the final CRC code, and data length $L_f$ of the last computing channel is P times of the number of bits R of the final CRC code. Therefore, the remainder conversion table corresponding to each of the computing channels varies with the two variables N and P which change with the data length of the data to be computed, which makes it impossible to allocate a fixed remainder conversion table to each of the computation channels.

Secondly, according to the descriptions of the application mentioned above, a remainder conversion table is required for each of the first N−1 calculating channels, which increases the required storage capacity of the computer significantly. For example, remainder conversion tables require a storage capacity of $[(N-1) \cdot 2^R \cdot R]$ bits for a computer with N computing channels. Therefore, the storage capacity required to be allocated to the remainder conversion tables by the computer increases significantly with the number of bits R of the final CRC code. For example, the storage capacity of the remainder conversion table corresponding to a single computing channel should be 16 GB to compute a 32-bit CRC code.

SUMMARY

It is an objective of the invention to provide a nested CRC code generation method for data transmission error control that is capable of addressing the problem of large storage capacity consumption and poor versatility in today's multi-channel and multi-bit CRC code generation method, and of generating a nested CRC code with an error correction capacity superior to the conventional CRC code.

To achieve the above objective, in accordance with one embodiment of the invention, there is provided a nested CRC code generation method for data transmission error control, comprising: (1) segmenting data to be computed by a data segmenting module, further comprising: (1.1) initializing the data in the data segmenting module to 0, and determining the maximum number of data segments to be N according to the number of calculating channels N, where N is a positive integer; (1.2) generating N+1 pointers ($P_0, P_1, \ldots, P_i, \ldots, P_N$) and N pointers ($p_1, p_2, \ldots, p_i, \ldots, p_N$) for the data segmenting module, where i is a positive integer and is less than or equal to N; dividing the data segmenting module into N data sections by the pointers ($P_0, P_1, \ldots, P_i, \ldots, P_N$), each of which can hold a data segment with a data length of $L_s$; and allocating each of the pointers ($p_1, p_2, \ldots, p_i, \ldots, p_N$) to each of the data sections according to the sequence of the N data sections, where $L_s$ can be any positive integer; (1.3) assigning fixed values to the pointers ($P_0, P_1, \ldots, P_i, \ldots, P_N$), where $P_i=P_{i-1}+L_s$, and $P_0$ can be any value, and $P_i$ is fixed during the whole computing process; (1.4) initializing the values of the pointers ($p_1, p_2, \ldots, p_i, \ldots, p_N$) of the N data sections to the values of the pointers ($P_0, P_1, \ldots, P_i, \ldots, P_{N-1}$) respectively; (1.5) filling the data to be computed into the data segmenting module and changing the values of the pointers ($p_1, p_2, \ldots, p_i, \ldots, p_N$) accordingly; (1.6) segmenting the data to be computed into m data segments by the data segmenting module and sending the value of m to a channel selector and a reverse channel selector; (1.7) transmitting W bits of each of the data segments to each of the m computing channels respectively in each clock cycle via the values of the pointers ($p_1, p_2, p_3, \ldots, p_m$) and the number of bits W a computing channel can process in parallel, and decreasing each of the values of the pointers ($p_1, p_2, p_3, \ldots, p_m$) by W; and (1.8) checking if the values of the pointers ($p_1, p_2, p_3, \ldots, p_m$) equal the values of the pointers ($P_0, P_1, P_2, \ldots, P_{m-1}$), and proceeding to step (2) if yes, otherwise returning to step (1.7); (2) allocating an appropriate CRC code computing channel to each of the data segments to be computed, further comprising: (2.1) generating a channel selecting table for the channel selector for generating a Qth nested CRC code for the data to be computed of different data types, so as to allocate a corresponding computing channel to each of the data input channels in each of the nested computing processes of data of different data types, where Q is a positive integer; (2.2) turning on the switches connecting the m outputs of the data segmenting module (1, 2, 3, . . . , m) and the channel selector by the channel selector according to the total number of the data segments m transmitted by the data segmenting module; and (2.3) connecting each of the selected m data inputs to a corresponding computing channel according to the channel selecting table; (3) computing a CRC sub-code for each of the data segments to be computed by the corresponding computing channel respectively, further comprising: (3.1) allocating each of the generating polynomial ($g_1(x), g_2(x), \ldots, g_i(x), \ldots, g_N(x)$) to each of the N computing channels correspondingly, where i can be any integer between 1 and N, and different computing channels can have the same generating polynomial; (3.2) realizing computing W bits in parallel in each of the computing channels by logic circuits or looking up remainder tables according to the corresponding generating polynomial; (3.3) setting an initial value for each of the computing channels according to the corresponding generating polynomial, where each computing channel is usually initialized to all 0s or 1s; and (3.4) generating m CRC sub-codes by computing a CRC sub-code for the input data of each of the computing channels respectively; (4) sorting the computed CRC sub-codes of the computing channels, further comprising: (4.1) using the same channel selecting table as the channel selector for the reverse channel selector; (4.2) turning on the switches for connecting m CRC sub-code registers (1, 2, 3, . . . , m) and the reverse channel selector by the reverse channel selector according to the total number m of the data segments transmitted by the data segmenting module; (4.3) connecting each of the m sub-code registers to the output of a corresponding computing channel according to the channel selecting table; and (4.4) storing each of the CRC sub-codes computed by the computing channels into a corresponding CRC sub-code register by the corresponding computing channel according to the selecting result of the reverse channel selector to generate a new data string ($CRC_1, CRC_2, \ldots, CRC_i, \ldots, CRC_m$), where i can be any integer between 1 and m, and $CRC_i$ is the computed CRC sub-code for the ith data segment; (5) checking if another multi-channel computing process is required, and returning to step (1) using the computed CRC sub-codes in step (4) as the new data to be computed if yes, otherwise proceeding to step (6), further comprising: (5.1) decreasing the nesting frequency of the CRC code Q by 1; and (5.2) checking if Q equals 0, and proceeding to step (6) if yes, otherwise returning to step (1) using the sorted CRC sub-codes in step (4) as the new data to be computed; and (6) computing the final Qth nested CRC code by the (N+1)th computing channel, further comprising: (6.1) allocating a generating polynomial $g_{N+1}(x)$ to the (N+1)th computing channel; (6.2) realizing computing W bits in parallel in the computing channel by logical circuits or looking up a remainder table according to the generating polynomial; (6.3) setting an initial value for the computing channel, where the initial value of the computing channel is usually set to all 0s or 1s; and (6.4) generating the final Qth nested CRC code by a last CRC code computing process with the sorted Qth computed CRC sub-codes in the computing channels.

In a class of this embodiment, the assignment of the values of the pointers ($p_1, p_2, \ldots, p_i, \ldots, p_N$) in step (1.5) further comprising: setting the value of $p_i$ to $P_i$ if the data length of the data segment to be computed in the ith data section is $L_s$; keeping the value of $p_i$ constant if the ith data section is empty; and adding 0 to the data segment to be computed in the mth data section accordingly to make the length of the data segment equal $L_s$ to ensure the synchronization of computation, for the original length of the mth data segment $L_f$ can be less than $L_s$, where m is derived by rounding the result of the original length of the data to be computed divided by $L_s$, and $L_f$ is the remainder of the original length of the data to be computed divided by $L_s$.

In a class of this embodiment, step (2.1) further comprising: (2.1.1) numbering the N computing channels and the N data output channels of the data segmenting module as (1, 2, 3, . . . , i, . . . , N) sequentially and respectively, where i can be any integer between 1 and N; (2.1.2) allocating a vector polynomial S(x) with a length of N~$\lceil \log_2 N \rceil$ bits to each item of the channel selecting table, where:

$$S(x) = m_{N \cdot \lceil \log_2 N \rceil - 1} x^{N \cdot \lceil \log_2 N \rceil - 1} + m_{N \cdot \lceil \log_2 N \rceil - 2} x^{N \cdot \lceil \log_2 N \rceil - 2} + \ldots + m_i x^i + \ldots + m_1 x^1 + m_0 x^0,$$

where $m_i$ equals 1 or 0 (where i=0, 1, 2, . . . , N·$\lceil \log_2 N \rceil$−1); (2.1.3) segmenting S(x) to N vectors ($s_1(x), s_2(x), \ldots, s_i(x), \ldots, s_N(x)$), each of which has a length of $\lceil \log_2 N \rceil$ bits, where i can be any integer between 1 and N, ($s_1(x), s_2(x), \ldots, s_i(x), \ldots, s_N(x)$) correspond to the N data output channels of the data segmenting module (1, 2, 3, . . . , i, . . . , N) respectively, where the value of $s_i(x)$ equals the serial number of the computing channel for the ith data segment; (2.1.4) fixing the data type of the data to be computed and generating Q vector polynomials S(x) as a line of items stored in the channel selecting table, each of which corresponds to a nested computing process; and (2.1.5) repeating step (2.1.4) according to the data type of the data to be computed to complete the channel selecting table.

It is another objective of the invention to provide a nested CRC code generation device for data transmission error control that is capable of computing a CRC code by multi-channel and multi-bit process and selecting corresponding computing channels for the data to be computed according to the data type of the data to be computed. The device characterizes in high computing speed and high flexibility.

To achieve the above objective, in accordance with another embodiment of the invention, there is provided a nested CRC code generation device for data transmission error control, comprising: a data segmenting module, configured to segment the data to be calculated to data segments with the same data length individually by adding 0 to the last data segments, and transmitting the data segments by transmitting certain number of bits of each of the data segments in parallel under the control of a clock; a computing channel selecting module, configured to connect each of the data input channels to an appropriate computing channel; a multi-channel CRC code computing module, configured to compute a CRC code for each of the data segments simultaneously; a data sorting module, configured to connect each of the data output of CRC code computing module to a corresponding register; a set of registers, configured to store the CRC codes; a data distributor, configured to distribute the input data; a counter, configured to record the times of computing the CRC codes and control the output of the data distributor; and a single-channel CRC code computing module, configured to compute the final CRC code.

Advantages of the invention are summarized as follow. A nested CRC code can be generated for the data to be computed with a data length less than or equal to $N \cdot L_s$ as a result of step (1), which results in high versatility. A nested CRC code can be generated by using the CRC sub-codes computed by the corresponding computing channels in the last cycle as the new data to be computed and repeating the computing process without remainder conversion tables as a result of step (7), which results in much less storage resources consumption. CRC code computation can be realized for each of the data segments of the data to be computed simultaneously by multi-bit process in parallel as a result of step (3) and step (6), which results in much higher processing speed and application in real-time high-speed data transmission networks, such as 10 GB Ethernet. A nested CRC code can be generated for data of different data types as a result of step (2) and step (4), which makes the invention applicable to converged networks such as FCoE networks based on 10 GB Ethernet. The amount of data required to be tested by an individual R-bit CRC code reduces by allocating a corresponding CRC code generation polynomial for each of the data segments of the data to be computed according to the error control principle of nested CRC codes as a result of step (3), step (5) and step (6), which results in superior error control capability.

DETAILED DESCRIPTION OF THE EMBODIMENTS

Further description will be given below in conjunction with accompanying drawings and specific embodiments.

Technical terms of the invention are explained as follow.

Nested CRC code: a 1st nested CRC code can be generated by using the CRC code computed by a conventional CRC code computer as the new data to be computed and completing another computing process by the conventional CRC code computer; and a Qth nested CRC code can be generated by repeating the above computing process Q times, where Q is a positive integer.

Computing channel: each of the computing channels mentioned in the invention is a conventional W-bit CRC code computer, where W is the number of bits a computer can process in a clock cycle; each of the computing channels is independent of each other and can carry out conventional CRC code computation independently; and a total of N+1 computing channels are used in the invention, where N can be any positive integer.

Generating polynomial g(x): generating polynomial is a binary data agreed by the data receiver and the data transmitter which is applied in the CRC code computation and is consistent in the data transmission process; and the number of bits of g(x) determines the number of bits R of the CRC code.

Figure 1:
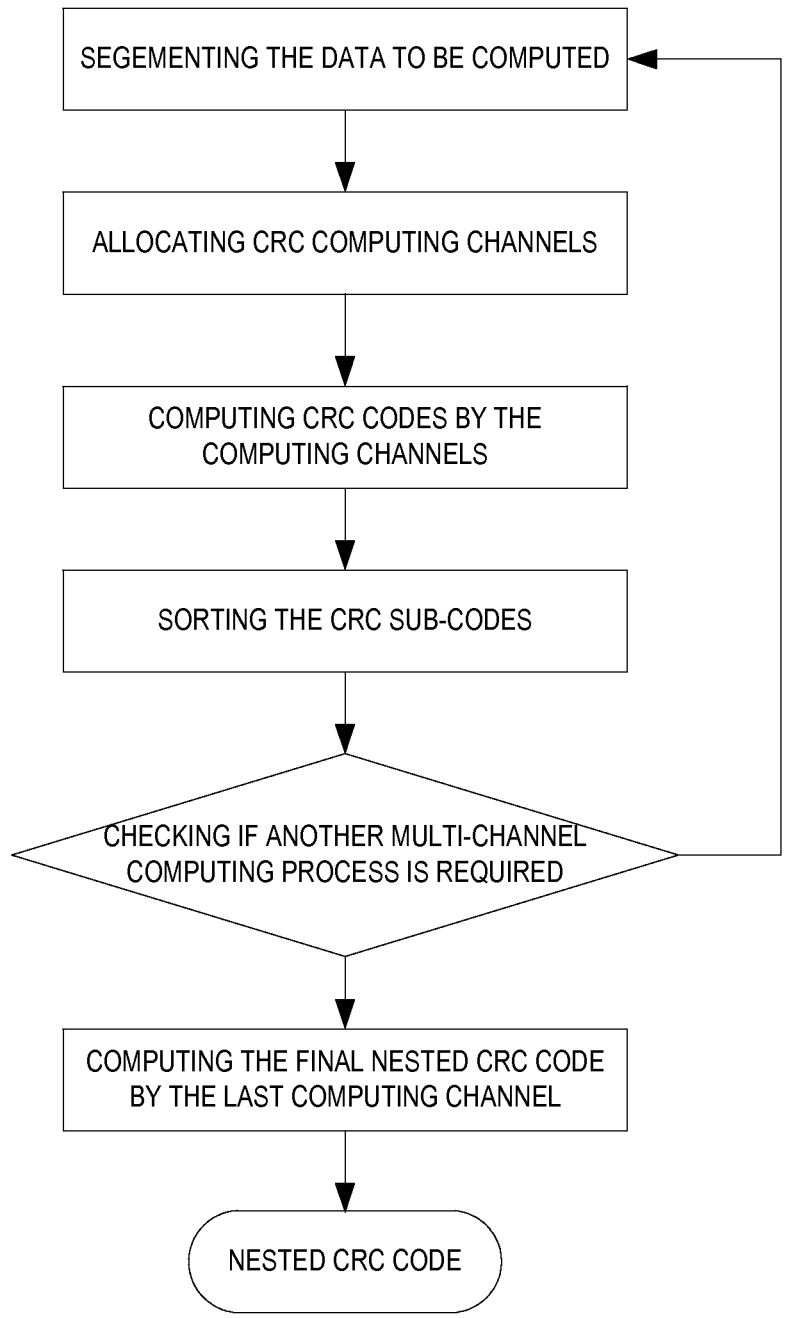
FIG. 1 is a flowchart of the nested CRC code generation method according to one embodiment.
Figure 2:
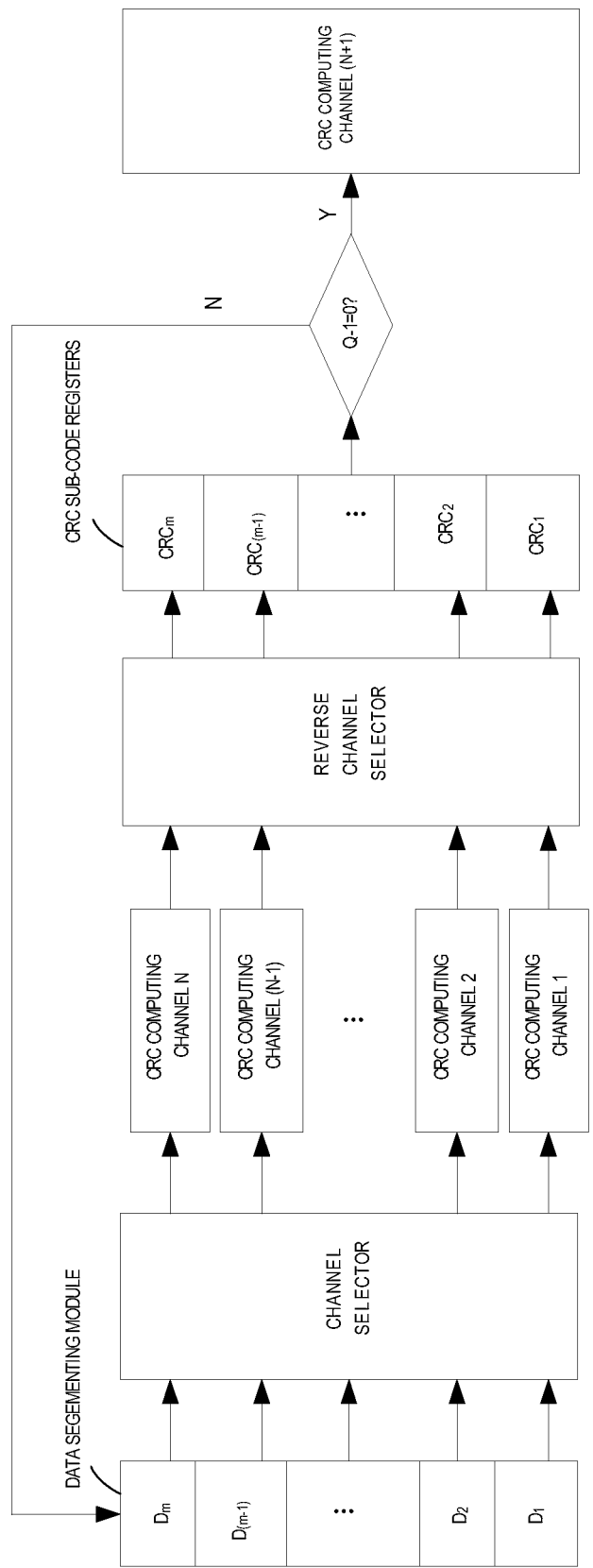
FIG. 2 is an explanatory schematic of the nested CRC code generation method according to one embodiment.

As shown in FIG. 1 and FIG. 2, the nested CRC code generation method for data transmission error control in the present invention comprises the following steps.

Figure 3:
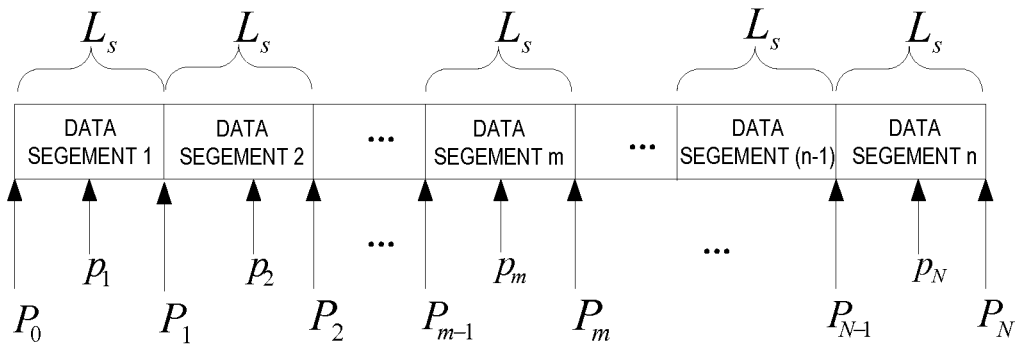
FIG. 3 is an explanatory schematic of the data segmenting module according to one embodiment.

(1) segmenting data to be computed by a data segmenting module, further comprising: (1.1) initializing the data in the data segmenting module to 0, and determining the maximum number of data segments to be N according to the number of calculating channels N, where N is a positive integer; (1.2) referring to FIG. 3, generating N+1 pointers ($P_0, P_1, \ldots, P_i, \ldots, P_N$) and N pointers ($p_1, p_2, \ldots, p_i, \ldots, p_N$) for the data segmenting module, where i is a positive integer and is less than or equal to N; dividing the data segmenting module into N data sections by the pointers ($P_0, \ldots, P_1, \ldots, P_i, \ldots, P_N$), each of which can hold a data segment with a data length of $L_s$; and allocating each of the pointers ($p_1, p_2, \ldots, p_i, \ldots, p_N$) to each of the data sections according to the sequence of the N data sections, where $L_s$ can be any positive integer; (1.3) assigning fixed values to the pointers ($P_0, P_1, \ldots, P_i, \ldots, P_N$), where $P_i=P_{i-1}+L_s$, and $P_0$ can be any value, and $P_i$ is fixed during the whole computing process; (1.4) initializing the values of the pointers ($p_1, p_2, \ldots, p_i, \ldots, p_{N-1}$) of the N data sections to the values of the pointers ($P_0, P_1, \ldots, P_i, \ldots, P_{N-1}$) respectively; (1.5) filling the data to be computed into the data segmenting module and changing the values of the pointers ($p_1, p_2, \ldots, p_i, \ldots, p_N$) accordingly, further comprising: setting the value of $p_i$ to $P_i$ if the data length of the data segment to be computed in the ith data section is $L_s$; keeping the value of $p_i$ constant if the ith data section is empty; and adding 0 to the data segment to be computed in the mth data section accordingly to make the length of the data segment equal $L_s$ to ensure the synchronization of computation, for the original length of the mth data segment $L_f$ can be less than $L_s$, where m is derived by rounding the result of the original length of the data to be computed divided by $L_s$, and $L_f$ is the remainder of the original length of the data to be computed divided by $L_s$; (1.6) segmenting the data to be computed into m data segments by the data segmenting module and transmitting the value of m to a channel selector and a reverse channel selector; (1.7) transmitting W bits of each of the data segments to each of the m computing channels respectively in each clock cycle via the values of the pointers ($p_1$, $p_2$, $p_3$, ..., $p_m$) and the number of bits W a computing channel can process in parallel, and decreasing each of the values of the pointers ($p_1$, $p_2$, $p_3$, ..., $p_m$) by W; and (1.8) checking if the values of the pointers ($p_1$, $p_2$, $p_3$, ..., $p_m$) equal the values of the pointers ($P_0$, $P_1$, $P_2$, ..., $P_{m-1}$), and proceeding to step (2) if yes, otherwise returning to step (1.7).

For example, in step (1), assuming the length of the data to be computed to be $[(m-1) \cdot L_s + L_f]$, the values of the pointers ($P_0$, $P_1$, ..., $P_{i-1}$, ..., $P_{N-1}$) of the data segmenting module are predetermined. The data to be computed is filled into the data segmenting module and is segmented into m data segments labeled as (1, 2, 3, ..., m) and each of the pointers ($p_1$, $p_2$, $p_3$, ..., $p_m$) is allocated to each of the m data segments sequentially. The values of the pointers ($p_1$, $p_2$, $p_3$, ..., $p_m$) are initialized to the values of the pointers ($P_0$, $P_1$, $P_2$, ..., $P_{m-1}$) and are set to the values of the pointers ($P_1$, $P_2$, $P_3$, ..., $P_m$) after the data to be computed is filled, where the length of the mth data segment is $L_f$ ($1 \leq L_f \leq L_s$), the data segmenting module is initialized to 0, and changing the value of $p_m$ from $P_{m-1}$ to $P_m$ is equivalent to extending the value of $p_m$ from $P_{m-1} + L_f$ to $P_m$ so that the data length of the mth data segment is extended to $L_s$ by adding 0. In the computing process, the data to be computed is sent to the computing channels by the pointers ($p_1$, $p_2$, $p_3$, ..., $p_m$). W bits of each of the data segments are sent to a corresponding computing channel in a clock cycle which can process W bits in parallel and each of the values of the pointers ($p_1$, $p_2$, $p_3$, ..., $p_m$) is reduced by W respectively. Computation in the data segmenting module is completed when the values of the pointers ($p_1$, $p_2$, $P_3$, ..., $p_m$) equal the values of the pointers ($P_0$, $P_1$, $P_2$, ..., $P_{m-1}$).

(2) allocating an appropriate CRC code computing channel to each of the data segments to be computed, further comprising: (2.1) generating a channel selecting table for the channel selector for generating a Qth nested CRC code for the data to be computed of different data types, so as to allocate a corresponding computing channel to each of the data input channels in each of the nested computing processes of the data of different data types, where Q is a positive integer, further comprising: (2.1.1) numbering the N computing channels and the N data output channels of the data segmenting module as (1, 2, 3, ..., i, ..., N) sequentially and respectively, where i can be any integer between 1 and N; (2.1.2) allocating a vector polynomial S(x) with a length of N·[$\log_2 N$] bits to each item of the channel selecting table, where $$S(x) = m_{N \cdot \lceil \log_2 N \rceil - 1} x^{N \cdot \lceil \log_2 N \rceil - 1} + m_{N \cdot \lceil \log_2 N \rceil - 2} x^{N \cdot \lceil \log_2 N \rceil - 2} + \ldots + m_i x^i + \ldots + m_1 x^1 + m_0 x^0,$$

where $m_i$ equals 1 or 0 (where i=0, 1, 2, ..., N[$\log_2 N$]−1); (2.1.3) segmenting S(x) to N vectors ($s_1(x)$, $s_2(x)$, ..., $s_i(x)$, ..., $s_N(x)$), each of which has a length of [$\log_2 N$] bits, where i can be any integer between 1 and N, and ($s_1(x)$, $s_2(x)$, ..., $s_i(x)$, ..., $s_N(x)$) correspond to the N data output channels of the data segmenting module (1, 2, 3, ..., i, ..., N) respectively, where the value of $s_i(x)$ equals the serial number of the computing channel for the ith data segment; (2.1.4) fixing the data type of the data to be computed and generating Q vector polynomials S(x) as a line of items stored in the channel selecting table, each of which corresponds to a nested computing process; and (2.1.5) repeating step (2.1.4) according to the data type of the data to be computed to complete the channel selecting table.

For example, in step (2.1), assuming there are a total of F different data types of the data to be computed, where F is a positive integer, a corresponding channel selecting table is shown in Table 1.

TABLE 1

| DATA TYPE | 1st COMPUTATION | 2nd COMPUTATION | ... | Qth COMPUTATION |
|---|---|---|---|---|
| TYPE 1 | $S(x)_1^1$ | $S(x)_2^1$ | ... | $S(x)_Q^1$ |
| TYPE 2 | $S(x)_1^2$ | $S(x)_2^2$ | ... | $S(x)_Q^2$ |
| . | ... | ... | ... | ... |
| . | | | | |
| TYPE (F − 1) | $S(x)_1^{F-1}$ | $S(x)_2^{F-1}$ | ... | $S(x)_Q^{F-1}$ |
| TYPE F | $S(x)_1^F$ | $S(x)_2^F$ | ... | $S(x)_Q^F$ |

Figure 4:
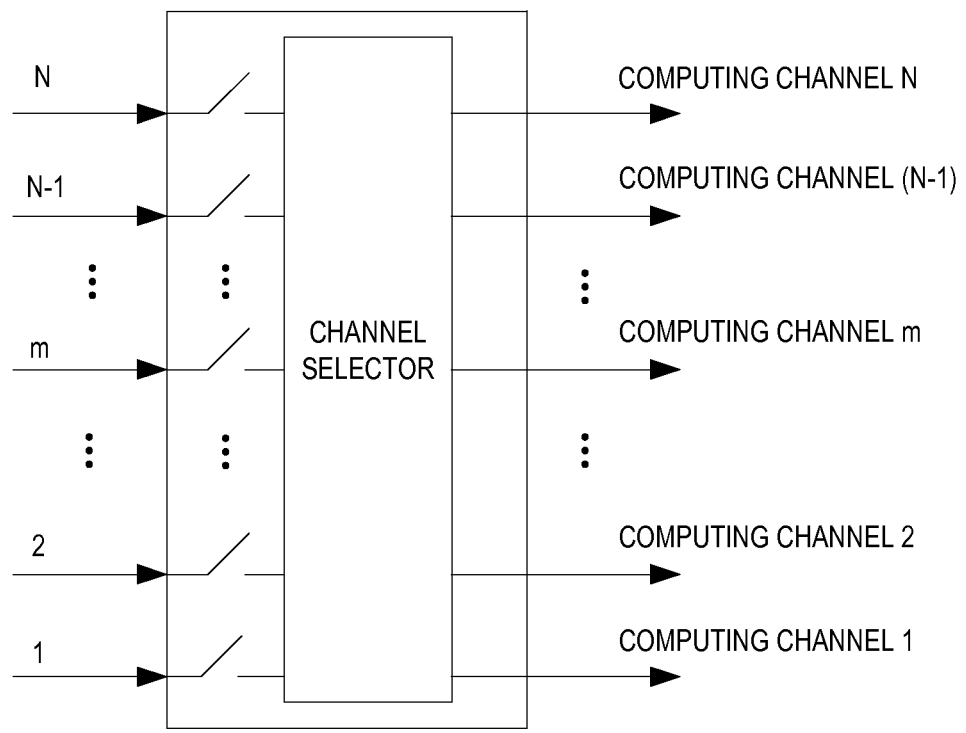
FIG. 4 is an explanatory schematic of the channel selector according to one embodiment.

(2.2) As shown in FIG. 4, turning on the switches for connecting the m outputs of the data segmenting module (1, 2, 3, ..., m) and the channel selector by the channel selector according to the total number of the data segments m transmitted by the data segmenting module.

(2.3) connecting each of the selected m data inputs to a corresponding computing channel according to the channel selecting table. For example, in step (2.3), assuming the data to be computed belongs to type 1, the data to be computed is segmented to m data segments and the channel selector turns on the switches connecting the first m data input channels and the channel selector. The computing channels are allocated according to $S(x)_1^1$ in the channel selecting table if the data is computed for the first time, where $S(x)_1^1 = (s_1(x)_1^1, s_2(x)_1^1, ..., s_i(x)_1^1, ..., s_N(x)_1^1)$, i can be any integer between 1 and N, and $s_1(x)_1^1$ has a data length of $\log_2 N$ bits. The total number of the filled data segments is m, therefore, the m computing channels are allocated via the values of ($s_1(x)_1^1$, $s_2(x)_1^1$, ..., $s_i(x)_1^1$, ..., $s_m(x)_1^1$), where i is can be any integer between 1 and m in this case. Assuming the value of $s_i(x)_1^1$ equals a decimal value k, where 0<k≤N, the ith data input channel is connected to the kth computing channel which compute the CRC code for the ith data segment.

(3) computing a CRC sub-code for each of the data segments to be computed by the corresponding computing channel respectively, further comprising: (3.1) allocating each of the generating polynomial ($g_1(x)$, $g_2(x)$, ..., $g_i(x)$, ..., $g_N(x)$) to each of the N computing channels correspondingly, where i can be any integer between 1 and N, and different computing channels can have the same generating polynomial; (3.2) realizing computing W bits in parallel in each of the computing channels by logic circuits or looking up remainder tables according to the corresponding generating polynomial; (3.3) setting an initial value for each of the computing channels according to the corresponding generating polynomial, where each computing channel is usually initialized to all 0s or 1s; and (3.4) generating m CRC sub-codes by computing a CRC sub-code for the input data of each of the computing channels respectively.

Figure 5:
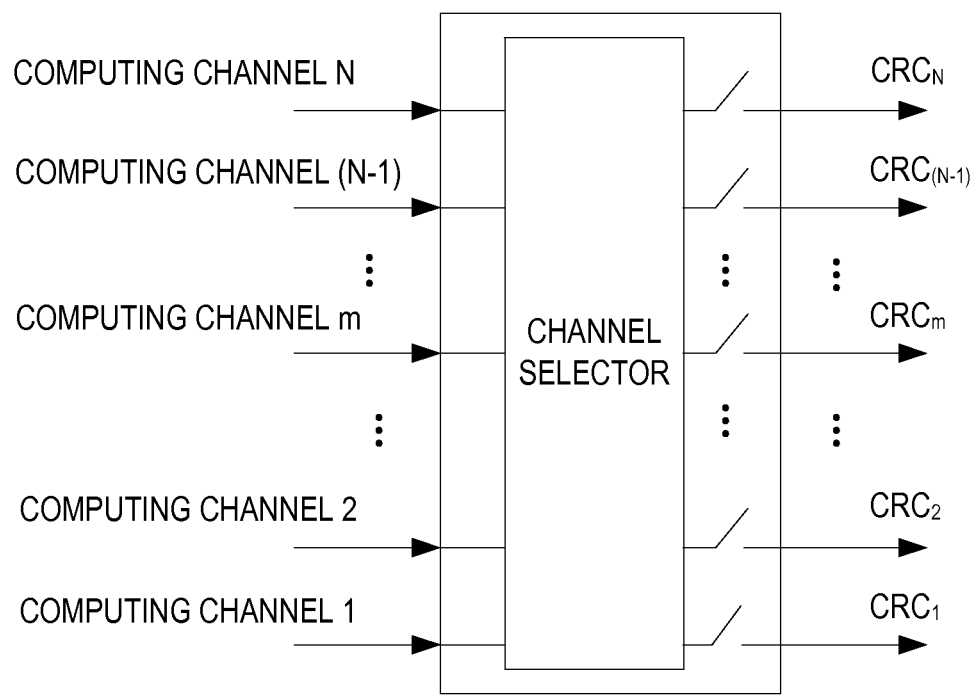
FIG. 5 is an explanatory schematic of the reverse channel selector according to one embodiment.

(4) sorting the computed CRC sub-codes of the computing channels, further comprising: (4.1) using the same channel selecting table as the channel selector for the reverse channel selector; (4.2) as shown in FIG. 5, turning on the switches for connecting m CRC sub-code registers (1, 2, 3, . . . , m) and the reverse channel selector by the reverse channel selector according to the total number m of the data segments transmitted by the data segmenting module; (4.3) connecting each of the m data outputs of the reverse channel selector to the output of a corresponding computing channel according to the channel selecting table; and (4.4) storing each of the CRC sub-codes computed by the computing channels into a corresponding CRC sub-code register by the corresponding computing channel according to the selecting result of the reverse channel selector to generate a new data string ($CRC_1$, $CRC_2$, . . . , $CRC_i$, . . . , $CRC_m$), where i can be any integer between 1 and m, and $CRC_i$, is the computed CRC sub-code for the ith data segment.

For example, in step (4), assuming the data to be computed belongs to type 1, the data to be computed is segmented to m data segments and the reverse channel selector turns on the switches connecting the first m CRC sub-code registers and the reverse channel selector. The computing channels are allocated to the m CRC sub-code registers according to $S(x)_1^1$ in the channel selecting table if the data is computed for the first time, where $S(x)_1^1 = (s_1(x)_1^1, s_2(x)_1^1, \ldots, s_i(x)_1^1, \ldots, s_N(x)_1^1)$, i can be any integer between 1 and N, and $s_1(x)_1^1$ has a data length of $\log_2 N$ bits. The total number of the filled data segments is m, therefore, the m CRC sub-codes are sorted via the values of $(s_1(x)_1^1, s_2(x)_1^1, \ldots, s_i(x)_1^1, \ldots, s_m(x)_1^1)$, where i is can be any integer between 1 and m in this case. Assuming the value of $s_i(x)_1^1$ equals a decimal value k, where $0 < k \leq N$, the output of the kth computing channel is connected to the ith CRC sub-code register so that the computing result of the ith data segment by the kth computing channel is stored in the ith CRC sub-code register and the order of the CRC sub-codes corresponds to the order of the data segments.

(5) checking if another multi-channel computing process is required, and returning to step (1) using the computed CRC sub-codes in step (4) as the new data to be computed if yes, otherwise proceeding to step (6), further comprising: (5.1) decreasing the nesting frequency of the CRC code Q by 1; and (5.2) checking if Q equals 0, and proceeding to step (6) if yes, otherwise returning to step (1) using the sorted CRC sub-codes in step (4) as the new data to be computed.

(6) computing the final Qth nested CRC code by the (N+1)th computing channel, further comprising: (6.1) allocating a generating polynomial $g_{N+1}(x)$ to the (N+1)th computing channel; (6.2) realizing computing W bits in parallel in the computing channel by logical circuits or looking up a remainder table according to the generating polynomial; (6.3) setting an initial value for the computing channel, where the initial value of the computing channel is usually set to all 0s or 1s; and (6.4) generating the final Qth nested CRC code by a last CRC code computing process with the sorted Qth computed CRC sub-codes in the computing channels.

Data transmission error control is realized by nested CRC codes generated by the above steps in the present invention. The principle of error control by nested CRC codes without changing the number of bits of the conventional CRC code is as follow.

(1) assuming the bit sequence of the data to be computed is $\{m_{k-1}, m_{k-2}, m_{k-3}, \ldots, m_i, \ldots, m_2, m_1, m_0\}$, which can be represented by a polynomial m(x), where $m(x) = m_{k-1}x^{k-1} + m_{k-2}x^{k-2} + \ldots + m_i x^i + \ldots + m_2 x^2 + m_1 x^1 + m_0 x^0$, where $m_i$ equals 1 or 0 (where $i = 0, 1, 2, \ldots, k-1$).

(2) segmenting the data to be computed to m−1 data segments ($D_m, D_{m-2}, \ldots, D_2$), each of which has a data length of $L_s$ bits, and a data segment D1 with a data length of $L_f$, where $1 \leq L_f \leq L_s$. The polynomials of the m data segments are as follow.

$$\begin{cases} D_m(x) = m_{k-1}x^{L_s-1} + m_{k-2}x^{L_s-2} + \ldots m_i x^i + \ldots + m_{k-L_s+2}x^2 + m_{k-L_s+1}x^1 + m_{k-L_s}x^0 \\ D_{m-1}(x) = m_{k-L_s-1}x^{L_s-1} + m_{k-L_s-2}x^{L_s-2} + \ldots m_i x^i + \ldots + m_{k-2L_s+2}x^2 + m_{k-2L_s+1}x^1 + m_{k-2L_s}x^0 \\ \vdots \\ D_2(x) = m_{k-(m-2)L_s-1}x^{L_s-1} + m_{k-(m-2)L_s-2}x^{L_s-2} + \ldots m_i x^i + \ldots + m_{k-(m-1)L_s+1}x^1 + m_{k-(m-1)L_s}x^0 \\ D_1(x) = m_{k-(m-1)L_s-1}x^{L_f-1} + m_{k-(m-1)L_s-2}x^{L_f-1} + \ldots m_i x^i + \ldots + m_2 x^2 + m_1 x^1 + m_0 x^0, \end{cases}$$

where $m_i$ equals 1 or 0 (where $i = 0, 1, 2, \ldots, k-1$).

(3) adding 0 to the last data segment $D_1$ which has a data length of $L_f$ to extend its data length to $L_s$. The polynomials of the m data segments after extension are as follow.

$$\begin{cases} D_m(x) = m_{k-1}x^{L_s-1} + m_{k-2}x^{L_s-2} + \ldots m_i x^i + \ldots + m_{k-L_s+2}x^2 + m_{k-L_s+1}x^1 + m_{k-L_s}x^0 \\ D_{m-1}(x) = m_{k-L_s-1}x^{L_s-1} + m_{k-L_s-2}x^{L_s-2} + \ldots m_i x^i + \ldots + m_{k-2L_s+2}x^2 + m_{k-2L_s+1}x^1 + m_{k-2L_s}x^0 \\ \vdots \\ D_2(x) = m_{k-(m-2)L_s-1}x^{L_s-1} + m_{k-(m-2)L_s-2}x^{L_s-2} + \ldots m_i x^i + \ldots + m_{k-(m-1)L_s+1}x^1 + m_{k-(m-1)L_s}x^0 \\ D_1(x) = m_{k-(m-1)L_s-1}x^{L_s-1} + m_{k-(m-1)L_s-2}x^{L_s-2} + \ldots m_i x^i + \ldots + m_1 x^{L_s-L_f+1} + m_0 x^{L_s-L_f}, \end{cases}$$

where $m_i$ equals 1 or 0 (where $i = 0, 1, 2, \ldots, k-1$).

(4) labeling the code composed by each of the data segments and a conventional CRC code as ($L_s + R, L_s$), where $L_s$ is the data length of each of the data segments, and R is the number of bits of a conventional CRC code. Each of the data segments corresponds to an independent generating polynomial. The following equations can be inferred according to the principle of CRC.

$$\begin{cases} x^R D_m(x) = Q_m(x)g_m(x) + r_m(x) \\ x^R D_{m-1}(x) = Q_{m-1}(x)g_{m-1}(x) + r_{m-1}(x) \\ \vdots \\ x^R D_i(x) = Q_i(x)g_i(x) + r_i(x) \\ \vdots \\ x^R D_2(x) = Q_2(x)g_2(x) + r_2(x) \\ x^R D_1(x) = Q_1(x)g_1(x) + r_1(x), \end{cases}$$

where i can be any integer between 1 and m, $Q_i(x)$ is the quotient polynomial of $x^R D_i(x)$ divided by $g_i(x)$, and $r_i(x)$ is the remainder polynomial of $x^R D_i(x)$ divided by $g_i(x)$. Each of the data segments can correspond to the same generating polynomial.

(5) realizing error control of each of the data segments of the data to be computed respectively by the m remainder polynomials $(r_1(x), r_2(x), \ldots, r_{m-1}(x), r_m(x))$ according to the principle of CRC so that error control of the whole data can be realized by $(r_1(x), r_2(x), \ldots, r_{m-1}(x), r_m(x))$.

(6) carrying out the above CRC code computing process Q times by using the remainder polynomials as the new data to be computed in the next cycle, for the bit width of $(r_1(x), r_2(x), \ldots, r_{m-1}(x), r_m(x))$ is m times of the number of bits of the original CRC code, so that the coding rate of the channels can be improved and the length of the conventional FCS field can be maintained.

(7) generally, Q=1 when the length of $(r_1(x), r_2(x), \ldots, r_{m-1}(x), r_m(x))$ is not very big. The data polynomial composed by $(r_1(x), r_2(x), \ldots, r_{m-1}(x), r_m(x))$ is as follow.

$$m(x)^1 = m_{mR-1}x^{mR-1} + m_{mR-2}x^{mR-2} + \ldots + m_i x^i + \ldots + m_2 x^2 + m_1 x^1 + m_0 x^0,$$

where $m_i$ equals 1 or 0 (where i=0, 1, 2, . . . , mR−1).

(8) labeling the code composed by the new data and a conventional CRC code as ((m+1)R, mR), where mR is the data length of the new data, and R is the number of bits of a conventional CRC code. The new data corresponds to a generating polynomial $g_{N+1}(x)$. The following equation can be inferred according to the principle of CRC: $x^R m(x)^1 = Q(x)^1 g_{N+1}(x) + r(x)^1$, where $Q(x)^1$ is the quotient polynomial of $x^R m(x)^1$ divided by $g_{N+1}(x)$, and $r(x)^1$ is the remainder polynomial of $x^R m(x)^1$ divided by $g_{N+1}(x)$.

(9) in the process of data transfer, error control of $(r_1(x), r_2(x), \ldots, r_{m-1}(x), r_m(x))$ is realized by $r(x)^1$, and error control of the original data is realized by $(r_1(x), r_2(x), \ldots, r_{m-1}(x), r_m(x))$, so that error control of the original data can be realized by $r(x)^1$. $r(x)^1$ is attached to the end of the data in the transmitter and the same computing process is applied to the received data by the nested CRC code generation method of the invention in the receiver so as to realize error control by the CRC code $r(x)^1$.

(10) Nested computing processes can be used to reduce the CRC code computing time of the (N+1)th computing channel when the length of $(r_1(x), r_2(x), \ldots, r_{m-1}(x), r_m(x))$ is big which can be realized by using the sorted CRC sub-codes in the ith cycle as the new data to be computed in the (i+1)th cycle to generate the (i+1)th set of CRC sub-codes by multi-channel computation, where i can be any integer between 1 and Q−1. The Qth set of CRC sub-codes, which are generated after the Qth multi-channel computation, are sorted and sent to the (N+1)th CRC computing channel to compute the final nested CRC code $r(x)^Q$.

(11) in the process of data transfer, error control of the ith computed CRC sub-codes is realized by the (i+1)th computed CRC sub-codes, error control of the Qth computed CRC sub-codes is realized by $r(x)^Q$, and error control of the data to be computed is realized by the 1st computed CRC sub-codes, so that error control of the original data can be realized by the nested CRC code $r(x)^Q$. $r(x)^Q$ is attached to the end of the data in the transmitter and the same computing process is applied to the received data by the nested CRC code generation method of the invention in the receiver so as to realize error control by the nested CRC code $r(x)^Q$.

Figure 6:
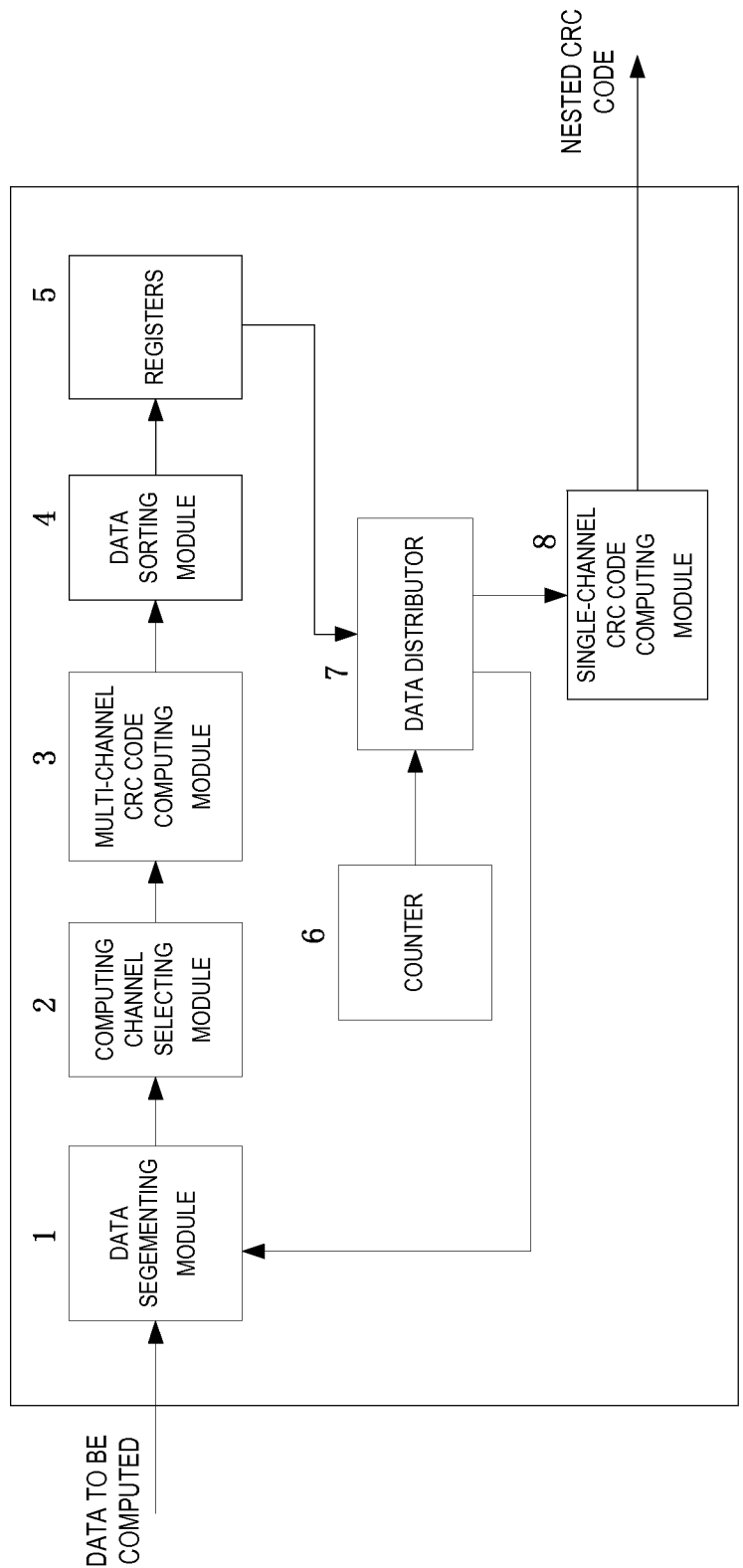
FIG. 6 is a schematic of the nested CRC code generation device according to one embodiment.

As shown in FIG. 6, the present invention provides a nested CRC code generation device for data transmission error control, comprising: a data segmenting module 1, a computing channel selecting module 2, a multi-channel CRC code computing module 3, a data sorting module 4, a set of registers 5, a counter 6, a data distributor 7 and a single-channel CRC code computing module 8.

The data segmenting module 1 is configured to segment the data to be computed to data segments with the same data length individually by adding 0 to the last data segment, and transmitting the data segments by transmitting certain number of bits of each of the data segments in parallel under the control of a clock;

The computing channel selecting module 2 is configured to connect each of the data input channels to an appropriate computing channel.

The multi-channel CRC code computing module 3 is configured to compute a CRC code for each of the data segments simultaneously.

The data sorting module 4 is configured to connect each of the data output channels to a corresponding register.

The set of registers 5 is configured to store the CRC codes.

The counter 6 is configured to record the times of computing the CRC codes and control the output of the data distributor 7.

The data distributor 7 is configured to distribute the input data and is controlled by the counter 6.

The single-channel CRC code computing module 8 is configured to compute the final CRC code.

The nested CRC code generation method of the present invention is further illustrated by the following example. Assuming the data to be computed is [0, 1, 2, . . . , 255; 0, 1, 2, . . . , 255; 0, 1, 2, . . . , 255; . . . ; 0, 1, 2, . . . , 63] which has 832 bytes, where high bytes are on the left and low bytes are on the right, the data type of the data to be computed is type T and the number of the bits of the CRC code is 32. The data length $L_s$ of each of the data segments is 128 bytes. Both CRC computation for the data segments and the final CRC computation correspond to the following generating polynomial:

$$g(x)=x^{32}+x^{26}+x^{23}+x^{22}+x^{16}+x^{12}+x^{11}+x^{10}+x^8+x^7+x^5+x^4+x^2+x+1.$$

Each of the computing channels and the final CRC computing channel can process 32 bits in parallel by hardware logic circuits, all the N+1 computing channels use the above generating polynomial, and the value of each of the computing channels is initialized to 0xFFFFFFFF. In terms of the above assumptions, only one nested computing process is required for data of type T according to the channel selecting table and only one switch vector $S(x)_1^T$ is allocated, where $$S(x)_1^T=(s_1(x)_1^T, s_2(x)_1^T, \ldots, s_N(x)_1^T)=(1,2,3,\ldots,N).$$

The specific computing process is as follow. The data to be computed is segmented to 7 data segments by the data segmenting module according to $L_s$. The data length of the data segments is labeled as (128,128,128,128,128,128,64) in bytes. Adding 64 bytes of 0 to the end of the last data segment extends its data length to 128 bytes. The channel selector turns on the switches connecting the first 7 data outputs of the data segmenting module and the channel selector and connects the 7 data outputs (1, 2, 3, . . . , 7) to the computing channels (1, 2, 3, . . . , 7) according to $S(x)_1^T$ of the channel selecting table. Each of the 7 data segments is sent to a corresponding computing channel by the pointers ($p_1, p_2, \ldots, p_7$). The 7 CRC sub-codes generated by the computing channels are (0x2F18B043, 0x4A68D5AC, 0x2F18B043, 0x4A68D5AC, 0x2F18B043, 0x4A68D5AC, 0x4C54F7D8). The reverse channel selector sorts the 7 CRC sub-codes according to $S(x)_1^T$. In this case, the CRC sub-codes have already been sorted, which means the order of the sorted CRC sub-codes is the same as that of the computing channels. In addition, only one nested computing process is required for data of type T, therefore, the final nested CRC code 0x3EC09838 can be computed by sending (0x2F18B043, 0x4A68D5AC, 0x2F18B043, 0x4A68D5AC, 0x2F18B043, 0x4A68D5AC, 0x4C54F7D8) directly to the last CRC code computing channel.

The nested CRC code is computed by multi-channel and multi-bit computing processes in the above example. The 7 computing channels can process 224 bits (32*7=224) of data in a single clock cycle, and the final nested CRC code is computed by the 7 CRC sub-codes in 7 clock cycles, therefore, the whole CRC code computing process can be completed in 39 clock cycles (32+7=39) for the data to be computed with a data length of 832 bytes when 1 nested computing process is introduced, where the computing process in the 7 computing channels can be completed in 32 clock cycles, and the computing process for the final CRC code can be completed in 7 clock cycles. The computing speed of the present invention is 170 times of the conventional serial CRC computer and is 7 times of the conventional 32-bit parallel CRC code computer, which improves the computing speed significantly. In the process of data transfer, error control of the 7 CRC sub-codes with a total data length of 224 bits (32*7=224) is realized by the final nested CRC code, and error control of each of the data segments is realized by a corresponding CRC sub-code of the 7 CRC sub-codes respectively, which reduces the amount of data controlled by a single CRC code compared with the conventional CRC code and results in superior error correction capability. Meanwhile, the error correction capability of the CRC code can be further improved and nested CRC codes for data of different data types can be computed by allocating different generating polynomials to the data segments. Therefore, the nested CRC code generation method of the present invention can be applied for error control in high-speed converged networks such as FCoE networks based on 10 GB Ethernet.

While particular embodiments of the invention have been shown and described, it will be obvious to those skilled in the art that changes and modifications may be made without departing from the invention in its broader aspects, and therefore, the aim in the appended claims is to cover all such changes and modifications as fall within the true spirit and scope of the invention.

What claimed is:

1. A nested CRC code generation method for data transmission error control, comprising:

(1) segmenting data to be computed by a data segmenting module, further comprising:

(1.1) initializing the data in the data segmenting module to 0, and determining the maximum number of data segments to be N according to the number of calculating channels N, where N is a positive integer;

(1.2) generating N+1 pointers ($P_0, P_1, \ldots, P_i, \ldots, P_N$) and N pointers ($p_1, p_2, \ldots, p_i, \ldots, p_N$) for the data segmenting module, where i is a positive integer and is less than or equal to N; dividing the data segmenting module into N data sections by the pointers ($P_0, P_1, \ldots, P_i, \ldots, P_N$), each of which can hold a data segment with a data length of $L_s$; and allocating each of the pointers ($p_1, p_2, \ldots, p_i, \ldots, p_N$) to each of the data sections according to the sequence of the N data sections, where Ls can be any positive integer;

(1.3) assigning fixed values to the pointers ($P_0, P_1, \ldots, P_i, \ldots, P_N$), where $P_i=P_j-1+L_s$, and P0 can be any value, and Pi is fixed during the whole computing process;

(1.4) initializing the values of the pointers ($p_1, p_2, \ldots, p_i, \ldots, p_N$) of the N data sections to the values of the pointers ($P_0, P_1, \ldots, P_i, \ldots, P_{N-1}$);

(1.5) filling the data to be computed into the data segmenting module and changing the values of the pointers ($p_1, p_2, \ldots, p_i, \ldots, p_N$) accordingly;

(1.6) segmenting the data to be computed into m data segments by the data segmenting module and sending the value of m to a channel selector and a reverse channel selector;

(1.7) transmitting W bits of each of the data segments to each of the m computing channels respectively in each clock cycle via the values of the pointers ($p_1, p_2, p_3, \ldots, p_m$) and the number of bits W a computing channel can process in parallel, and decreasing each of the values of the pointers ($p_1, p_2, p_3, \ldots, p_m$) by W; and (1.8) checking if the values of the pointers ($p_1, p_2, p_3, \ldots, p_m$) equal the values of the pointers ($P_0, P_1, P_2, \ldots, P_{m-1}$), and proceeding to step (2) if yes, otherwise returning to step (1.7);

(2) allocating an appropriate CRC code computing channel to each of the data segments to be computed, further comprising:

(2.1) generating a channel selecting table for the channel selector for generating a Qth nested CRC code for the data to be computed of different data types, so as to allocate a corresponding computing channel to each of the data input channels in each of the nested computing processes of the data to be computed of different data types, where Q is a positive integer;

(2.2) turning on switches connecting m outputs of the data segmenting module (1, 2, 3, . . . , m) and the channel selector by the channel selector according to the total number of the data segments m transmitted by the data segmenting module; and (2.3) connecting each of the selected m data inputs of the channel selector to a corresponding computing channel according to the channel selecting table;

(3) computing a CRC sub-code for each of the data segments to be computed by the corresponding computing channel, further comprising:

(3.1) allocating each of generating polynomials ($g_1(x), g_2(x), \ldots, g_i(x), \ldots, g_N(x)$) to each of the N computing channels correspondingly, where i can be any integer between 1 and N, and different computing channels can have the generating polynomials;

(3.2) realizing computing W bits in parallel in each of the computing channels by logic circuits or looking up remainder tables according to the generating polynomials;

(3.3) setting an initial value for each of the computing channels according to the generating polynomials, where each computing channel is usually initialized to all 0s or 1s; and (3.4) generating m CRC sub-codes by computing a CRC sub-code for the input data segment of each of the computing channels;

(4) sorting the computed CRC sub-codes of the computing channels, further comprising:

(4.1) using a same channel selecting table as the channel selector for the reverse channel selector;

(4.2) turning on the switches for connecting m CRC sub-code registers (1, 2, 3, . . . , m) and the reverse channel selector by the reverse channel selector according to the total number m of the data segments transmitted by the data segmenting module;

(4.3) connecting each of m data outputs of the reverse channel selector to an output of the corresponding computing channel according to the channel selecting table; and (4.4) storing each of the CRC sub-codes computed by the computing channels into a corresponding CRC sub-code register by the corresponding computing channel according to the selecting result of the reverse channel selector to generate a new data string ($CRC_1$, $CRC_2$, . . . , $CRC_i$, . . . , $CRC_m$), where i can be any integer between 1 and m, and $CRC_i$ is the computed CRC sub-code for the ith data segment;

(5) checking if another multi-channel computing process is required, and returning to step (1) using the computed CRC sub-codes in step (4) as the new data to be computed if yes, otherwise proceeding to step (6), further comprising:

(5.1) decreasing a nesting frequency of a CRC code Q by 1; and (5.2) checking if Q equals 0, and proceeding to step (6) if yes, otherwise returning to step (1) using the sorted CRC sub-codes in step (4) as the new data to be computed; and (6) computing a final Qth nested CRC code by a (N+1)th computing channel, further comprising:

(6.1) allocating the generating polynomial $g_{N+1}(x)$ to the (N+1)th computing channel;

(6.2) realizing W bits in parallel in the (N+1)th computing channel by logical circuits or looking up a remainder table according to the generating polynomial;

(6.3) setting an initial value for the (N+1)th computing channel, where the initial value of the (N+1)th computing channel is usually set to 0 or 1; and (6.4) generating a final Qth nested CRC code by a last CRC code computing process with sorted Qth computed CRC sub-codes by the (N+1)th computing channels.

2. The method of claim 1, wherein the assignment of the values of the pointers ($p_1, p_2, \ldots, p_i, \ldots, p_N$) in step (1.5) further comprises:

setting the value of $p_i$ to $P_i$ if the data length of the data segment to be computed in the ith data section is $L_s$;

keeping the value of pi constant if the ith data section is empty; and adding 0 to the data segment to be computed in the mth data section accordingly to make the length of the mth data segment equal Ls to ensure the synchronization of computation, for the original length of the data segment Lf can be less than Ls, wherein m is derived by rounding the result of the original length of the data to be computed divided by Ls, and Lf is the remainder of the original length of the data to be computed divided by Ls.

3. The method of claim 1, wherein step (2.1) further comprises:

(2.1.1) numbering the N computing channels and the N data output channels of the data segmenting module as (1, 2, 3, . . . , , N) sequentially, where i can be any integer between 1 and N;

(2.1.2) allocating a vector polynomial S(x) with a length of $N \cdot \lceil \log_2 N \rceil$ bits to each item of the channel selecting table, wherein:

$$S(x) = m_{N \cdot \lceil \log_2 N \rceil - 1} x^{N \cdot \lceil \log_2 N \rceil - 1} + m_{N \cdot \lceil \log_2 N \rceil - 2} x^{N \cdot \lceil \log_2 N \rceil - 2} + \ldots + m_i x^i + \ldots + m_1 x^1 + m_0 x^0,$$

wherein mi equals 1 or 0 (where i=0, 1, 2, . . . , $N \cdot \lceil \log_2 N \rceil - 1$);

(2.1.3) segmenting S(x) to N vectors (s1(x), s2(x), . . . , si(x), . . . , sN(x)), each of which has a length of $\lceil \log_2 N \rceil$ bits, where i can be any integer between 1 and N, and ($s_1(x), s_2(x), \ldots, s_i(x), \ldots, s_N(x)$) correspond to the N data outputs of the data segmenting module (1, 2, 3, . . . , i, . . . , N), wherein the value of $s_i(x)$ equals the serial number of the computing channel for the ith data segment;

(2.1.4) fixing a data type of the data to be computed and generating Q vector polynomials S(x) as a line of items stored in the channel selecting table, each of which corresponds to a nested computing process; and (2.1.5) repeating step (2.1.4) according to the data type of the data to be computed to complete the channel selecting table.

4. A nested CRC code generation device for data transmission error control, comprising:

a data segmenting module, configured to segment a single frame of data to multiple data segments with a same data length individually by adding 0 to a last data segment, and transmitting the data segments by transmitting certain number of bits of each of the data segments in parallel under control of a clock;

a computing channel selecting module, configured to connect each of data segments to an appropriate computing channel of a multi-channel CRC code computing module;

the multi-channel CRC code computing module, configured to compute a CRC sub-code for each of the data segments simultaneously in parallel, wherein each channel of the multi-channel CRC code computing module independently selects a generating polynomial to compute the CRC sub-code;

a data sorting module, configured to connect the CRC sub-code to a corresponding register in parallel, wherein the data sorting module keeps a same channel sequence as the computing channel selecting module;

a set of registers, configured to store the CRC sub-codes;

a data distributor, configured to distribute the stored CRC sub-codes;

a counter, configured to record nested computing times of the CRC sub-codes and control outputting of the data distributor to a single-channel CRC code computing module; and the single-channel CRC code computing module, configured to compute a final nested CRC code using the stored CRC sub-codes.

\* \* \* \* \*